(12) United States Patent
Hasegawa (10) Patent No.: US 7,592,868 B2
(45) Date of Patent: Sep. 22, 2009

(54) RAIL-TO-RAIL AMPLIFIER CIRCUIT AND SEMICONDUCTOR DEVICE

(75) Inventor: Kazuhiro Hasegawa, Ichinomiya (JP)

(73) Assignees: Sanyo Electric Co., Ltd. (JP); SANYO Semiconductor Co., Ltd. (JP)

( * ) Notice: Subject to any disclaimer, the term of this patent is extended or adjusted under 35 U.S.C. 154(b) by 8 days.

(21) Appl. No.: 12/043,227

(22) Filed: Mar. 6, 2008

(65) Prior Publication Data

US 2008/0224777 A1    Sep. 18, 2008

(30) Foreign Application Priority Data

Mar. 6, 2007    (JP)    ............................... 2007-056380

(51) Int. Cl.
*H03F 3/45*    (2006.01)
(52) U.S. Cl. ..................................... 330/253
(58) Field of Classification Search ................. 330/253; 341/136, 144, 118
See application file for complete search history.

(56) References Cited

U.S. PATENT DOCUMENTS 4,797,631 A * 1/1989 Hsu et al. ................... 330/253
7,187,235 B2    3/2007 Moon

FOREIGN PATENT DOCUMENTS

JP    2005-124173 A    5/2005

* cited by examiner

*Primary Examiner*—Robert Pascal
*Assistant Examiner*—Khiem D Nguyen
(74) *Attorney, Agent, or Firm*—Cantor Colburn LLP (57) ABSTRACT

A rail-to-rail amplifier for amplifying an analog signal from a DAC includes a first differential input section, which includes an n-channel transistor pair, a second differential input section, which includes a p-channel transistor pair, a first current supply provided between the second differential input section and a high voltage side supply, and a current controller for the second input section provided between the first current supply and the second differential input section for controlling the current supply to the second differential input section in accordance with data of a predetermined bit position in input digital data to the DAC. A second current supply is provided between a low voltage side supply and the first differential input section and a current controller for the first input section is provided between the second current supply and the first differential input section for controlling the current supply to the first differential input section in accordance with data of a predetermined bit position in input digital data to the DAC.

4 Claims, 8 Drawing Sheets

RAIL-TO-RAIL AMPLIFIER CIRCUIT AND SEMICONDUCTOR DEVICE

CROSS-REFERENCE TO RELATED APPLICATIONS

The entire disclosure of Japanese Patent Application No. 2007-056380 including specification, claims, drawings, and abstract is incorporated herein by reference.

BACKGROUND OF THE INVENTION

1. Field of the Invention

The present invention relates to a semiconductor device including a rail-to-rail amplifier circuit.

2. Description of the Related Art

Figure 1:
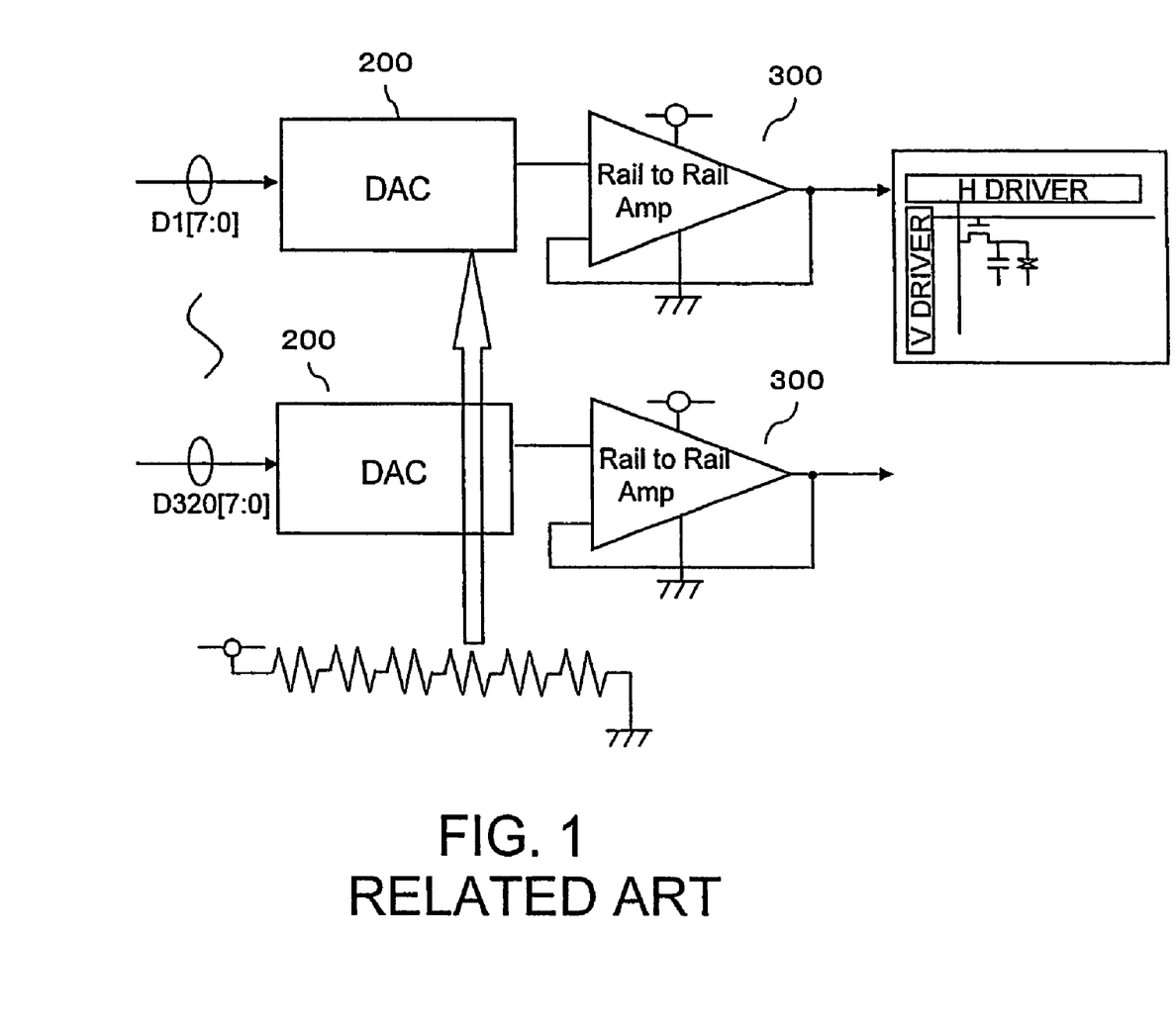
FIG. 1 shows an example of a configuration of rail-to-rail amplifiers of the related art and DACs supplying analog signals to these amplifiers.

FIG. 1 conceptually shows a method of using digital-to-analog converter (DAC) circuits 200 and rail-to-rail operational amplifiers 300 to drive a load (for example, pixels of a liquid crystal display panel) in a subsequent stage. If it is preferable for the operational amplifiers 300 to amplify and output signals supplied from the DAC circuits 200 to signals of maximum amplitude in a supply voltage range from high voltage to low voltage, the adoption of rail-to-rail amplifiers capable of maximizing the output amplitude to approximate the supply voltage range is effective.

The rail-to-rail amplifiers 300, which include a differential input Nin including an n-channel transistor pair and a differential input Pin including a p-channel transistor pair, select the operation of the differential input Pin and the differential input Nin in accordance with the voltage of an input signal, and output an amplified signal with an amplitude of the entire voltage range from high-voltage supply Vcc to low-voltage supply Vss of the amplifier with respect to the input voltage. This type of rail-to-rail amplifier is disclosed in Japanese Patent Laid-Open Publication 2005-124173 and so forth.

Figure 2:
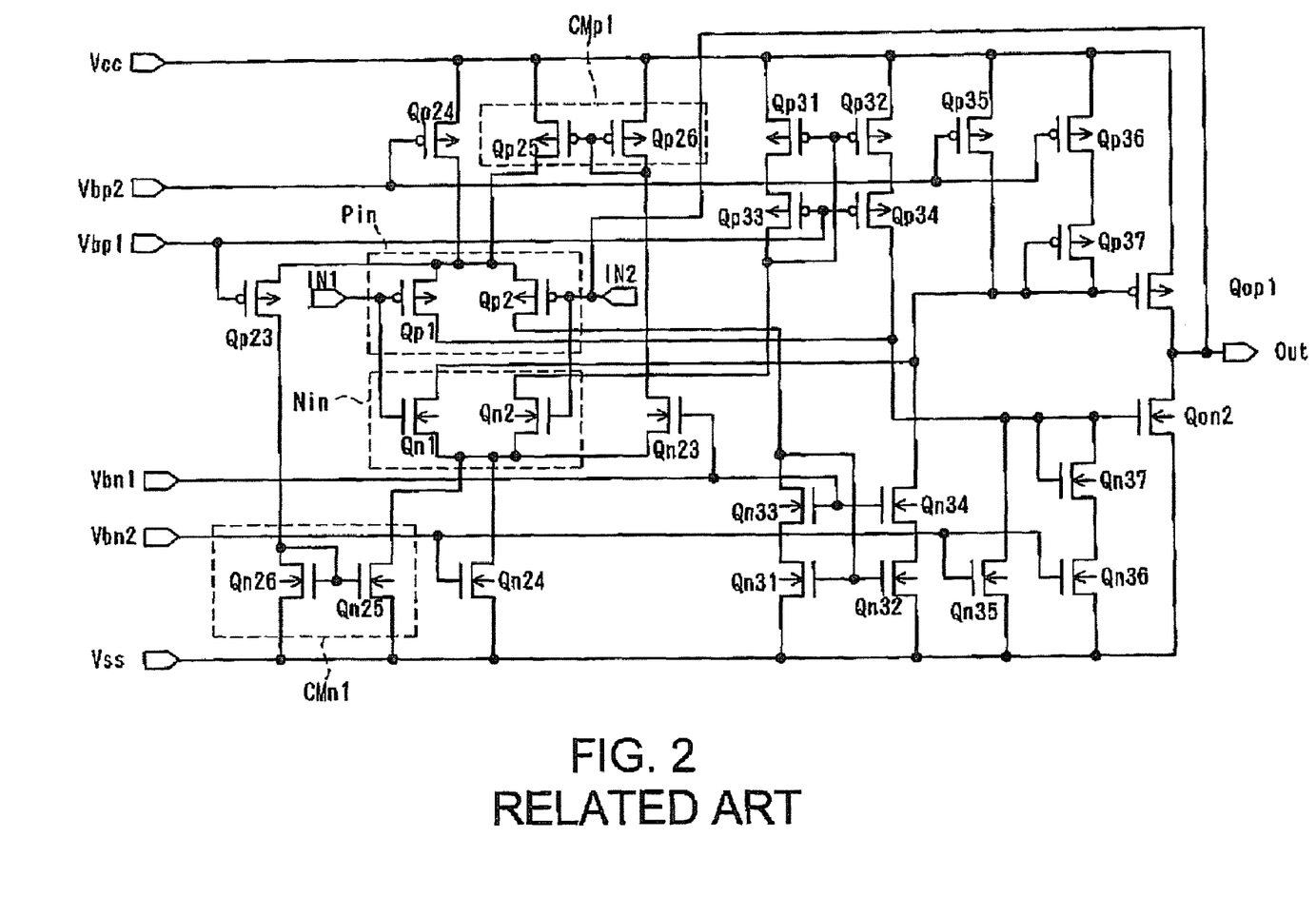
FIG. 2 shows an example of a circuit configuration of the rail-to-rail amplifier of the related art.

FIG. 2 shows one example of a circuit configuration of the rail-to-rail operational amplifier of the related art. An operational amplifier has a positive input terminal IN1 and an inverting input terminal IN2 at a differential input section and further a differential input Nin configured from a differential pair of n-channel transistors Qn1 and Qn2 and a differential input Pin configured from a differential pair of p-channel transistors Qp1 and Qp2, where the differential inputs Nin and Pin are respectively connected to the transistors corresponding to both terminals IN1 and IN2.

Between the differential input Pin and the high-voltage supply Vcc are provided an always-on p-channel transistor (hereinafter referred to as a current supply transistor) Qp24, which functions as a current supply, and p-channel transistors Qp25 and Qp26 forming a current mirror circuit CMp1. A gate electrode of the current supply transistor Qp24 is connected to a bias supply Vbp2 and the current supply transistor Qp24 supplies a constant current from the supply Vcc to a terminal connected in common with the differential input Pin in accordance with the bias supply voltage Vbp2.

A source electrode of the current input side transistor Qp26 of the current mirror circuit CMp1 is connected to the supply Vcc and gate and drain electrodes are connected to each other and connected to a drain electrode of an n-channel transistor Qn23.

A source electrode of the n-channel transistor Qn23 is connected to a common terminal of the differential input Nin and a drain electrode of an always-on current supply transistor Qn24 while a gate electrode is connected to a bias supply Vbn1.

Between the differential input Nin and the low-voltage supply Vss are provided the always-on n-channel transistor (hereinafter referred to as a current supply transistor) Qn24, which functions as a current supply, and n-channel transistors Qn25 and Qn26 forming a current mirror circuit CMn1. A gate electrode of the current supply transistor Qn24 is connected to a bias supply Vbn2 and the current supply transistor Qn24 draws a constant current from the terminal connected in common with the differential input Nin to the supply Vss in accordance with the bias supply voltage Vbn2.

Furthermore, the current input side transistor Qn26 of the current mirror circuit CMn1 has a source electrode connected to the supply Vss and gate and drain electrodes connected to each other and connected to a drain electrode of a p-channel transistor Qp23. A source electrode of the p-channel transistor Qp23 is connected to a common terminal of the differential input Pin and a drain electrode of the current supply transistor Qp24, and a gate electrode of the transistor Qp23 is connected to a bias supply Vbp1.

The rail-to-rail amplifier 300 that includes the differential input section, current supply, and current mirror circuit further includes a buffer section and an output section. The buffer section includes transistors Qp31 to Qp37 and Qn31 to Qn37. The output section includes a p-channel output transistor Qop1, which is provided between the high voltage side supply Vcc and an output terminal Out, and an n-channel output transistor Qon1, which is provided between the low voltage side supply Vss and the output terminal Out. At the buffer section, the current of a differential signal is adjusted in accordance with signals input by the differential inputs Pin and Nin, and an amplified signal is output from the output terminal Out in accordance with the difference in voltages applied to the positive input terminal IN1 and the inverting input terminal IN2. Negative feedback is provided for the amplifier 300 by connecting the inverting input terminal IN2 with the output terminal Out.

In a voltage range where the voltage of an analog signal supplied to the positive input terminal IN1 from the DAC 200 is lower than a voltage Vpcom−|Vthp|, which is the common terminal voltage (VPcom) of the differential input Pin minus a threshold voltage (|Vthp|) of the transistor Qp1, and lower than a voltage VNcom+|Vthn|, which is the voltage at the common terminal (VNcom) of the differential input Nin to which is added a threshold voltage (|Vthn|) of the transistor Qn1, only the differential input Pin operates. Generally, in the voltage range where only the differential input Pin operates, the n-channel transistor Qn23 is set to turn on, a current flows to the transistor Qp26 of the current mirror circuit CMp1 in accordance with the amount of current drawn by the current supply transistor Qn24 toward the low voltage side supply Vss, and a corresponding current is supplied via the transistor Qp25 to a terminal in common with the transistor pair at the differential input Pin.

In a voltage range where the voltage of the analog signal supplied to the positive input terminal IN1 is higher than the common input terminal of the differential input Nin by the amount of the threshold voltage of the transistor Qn1 and where the above-mentioned differential input Pin is operational, both differential inputs Pin and Nin operate. As the above-mentioned differential input Nin operates, the voltage of the common terminal rises, and when it becomes higher than the bias voltage Vbn1 by the amount of the operating threshold voltage of the transistor Qp23, the transistor Qn23 turns off and the current mirror circuit CMp1 does not operate. Furthermore, since the difference between the voltage of the common terminal of the differential input Pin during operation and the bias voltage Vbp1 is set so as to be smaller than the operating threshold voltage of the transistor Qp23, the p-channel transistor Qp23 turns off and the current mirror circuit CMn1 does not operate.

When the voltage of the analog signal supplied to the positive input terminal IN1 becomes higher than the voltage (Vpcom−|Vthp|) at which the differential input Pin is operational, the differential input Pin does not operate, and when it is higher than the voltage (Vncom+|Vthn|) at which the differential input Nin is operational, only the differential input Nin operates. In this case, the voltage of the common input terminal of the differential input Pin, to which is connected the source electrode of the p-channel transistor Qp23, is high, the p-channel transistor Qp23 turns on, the current mirror circuit CMn1 operates, a current flows via the transistor Qp23 to the transistor Qn26 of the current mirror circuit CMn1 in accordance with the amount of current flowing from the high voltage side supply Vcc through the current supply transistor Qp24, and a corresponding current is drawn via the transistor Qn25 from the terminal in common with the transistor pair at the differential input Nin.

The above-mentioned amplifier 300 operates as a rail-to-rail amplifier and can yield an output voltage substantially covering the supply voltage range (Vss to Vcc). However, as described hereinabove, the current mirror circuits CMp1 and CMn1 are included in addition to the current supply transistors Qp24 and Qn24 so that the total currents respectively flowing through the two differential inputs Pin and Nin are equal both in the voltage range where only the differential input Pin operates or where only the differential input Nin operates and in the voltage range where both differential inputs Pin and Nin operate. The current mirror circuits CMp1 and CMn1 are current elements and require a large substrate area to be included into an integrated circuit. Furthermore, at an input voltage range on the low voltage side where only the differential input Pin operates, power dissipation due to the current flowing through the current mirror circuit CMp1 cannot be avoided, and at an input voltage range on the high voltage side where only the differential input Nin operates, power dissipation due to the current flowing through the current mirror circuit CMn1 cannot be avoided.

Accordingly, a method can be devised in which are provided two so-called single-channel input amplifiers having only p-channel or n-channel differential inputs, and in which these two amplifiers are selected in accordance with an input voltage. However, if two amplifiers having opposite polarities are used, the differential linearity error at the switching part for the two amplifiers becomes large. In particular, the switching part for the two amplifiers is in the vicinity of the center of the voltage amplitude of the input analog signal and although the probability of the analog signal existing in such a range is generally high, an increase in error in this region is not desirable. Furthermore, since two amplifiers are required, the number of elements increases two times, which is disadvantageous in terms of minimizing the surface area of the overall device, which includes the amplifiers.

SUMMARY OF THE INVENTION

The present invention achieves lower power dissipation in a rail-to-rail amplifier.

The present invention is a rail-to-rail amplifier for amplifying an analog signal from a digital-to-analog converter and includes a first differential input section, which includes an n-channel transistor pair, a second differential input section, which includes a p-channel transistor pair, a first current supply, provided between the second differential input section and a high voltage side first supply line, for supplying current from the first supply line to the second differential input section, a current controller for a second input section, provided between the first current supply and the second differential input section, for controlling the current supply from the first current supply to the second differential input section in accordance with digital data at a predetermined bit position in input digital data to the digital-to-analog converter, a second current supply, provided between a low voltage side second supply line and the first differential input section, for supplying current from the first differential input section to the second supply line, and a current controller for a first input section, provided between the second current supply and the first differential input section, for controlling the current supply from the first differential input section to the second current supply in accordance with digital data at a predetermined bit position in input digital data to the digital-to-analog converter.

In the above-mentioned rail-to-rail amplifier according to another aspect of the present invention, the digital data supplied to the current controller for the first input section and the current controller for the second input section is the most significant bit of the input digital data to the digital-to-analog converter.

In the above-mentioned rail-to-rail amplifier according to another aspect of the present invention, the digital data supplied to the current controller for the first input section and the current controller for the second input section is data of multiple most significant bit positions including the most significant bit data of the input digital data to the digital-to-analog converter, and in accordance with the supplied data of multiple bit positions, a ratio of current flowing to the first differential input section and the second differential input section is controlled.

According to another aspect of the present invention, a semiconductor device includes a digital-to-analog converter and a rail-to-rail amplifier for amplifying an analog signal from the digital-to-analog converter, where the rail-to-rail amplifier includes a first differential input section, which includes an n-channel transistor pair, a second differential input section, which includes a p-channel transistor pair, a first current supply, provided between the second differential input section and a high voltage side first supply line, for supplying current from the first supply line to the second differential input section, a current controller for a second input section, provided between the first current supply and the second differential input section, for controlling the current supply from the first current supply to the second differential input section in accordance with digital data at a predetermined bit position in input digital data to the digital-to-analog converter, a second current supply, provided between the first differential input section and a low voltage side second supply line, for supplying current from the first differential input section to the second supply line, and a current controller for a first input section, provided between the second current supply and the first differential input section, for controlling the current supply from the first differential input section to the second current supply in accordance with digital data at a predetermined bit position in input digital data to the digital-to-analog converter. Furthermore, the digital data supplied to the current controller for the first input section and the current controller for the second input section is data of multiple most significant bit positions including the most significant bit of input digital data to the digital-to-analog converter, and in accordance with the supplied data of multiple most significant bit positions, the ratio of current flowing to the first differential input section and the second differential input section is controlled and a differential linearity error of the digital-to-analog converter is adjusted.

According to the present invention, selecting the current supply path to the first and second differential inputs of the rail-to-rail amplifier using predetermined bits (for example, bits on the most significant side) in the input digital signal to the digital-to-analog converter for supplying the analog signal to the amplifier enables the sum of the currents flowing to the first and second differential inputs to be maintained at a constant.

For this reason, the current mirror circuit is unnecessary and the current consumption by this mirror circuit can be eliminated. Furthermore, since n-channel and p-channel differential inputs can be provided within one amplifier and the signals obtained by these differential inputs can be amplified and output by a common buffer section and output section, the amplifier can be configured from a minimum of circuit elements.

Furthermore, since a single amplifier is used to amplify the input analog signal, the amplification is executed while selecting the first differential input and the second differential input. The process can always be performed with consistent amplification characteristics and with a common buffer and output section. Thus, the differential linearity error with respect to the input digital signal to the digital-to-analog converter can be maintained within tolerance.

Furthermore, by supplying multiple most significant bits of the digital signal to the amplifier, it becomes easier to reduce the differential linearity error, which has a tendency to rise during selection of the first and second differential inputs.

DETAILED DESCRIPTION OF THE PREFERRED EMBODIMENTS

Preferred embodiments of the present invention will be described with reference to the attached drawings.

Embodiment 1

Figure 3:
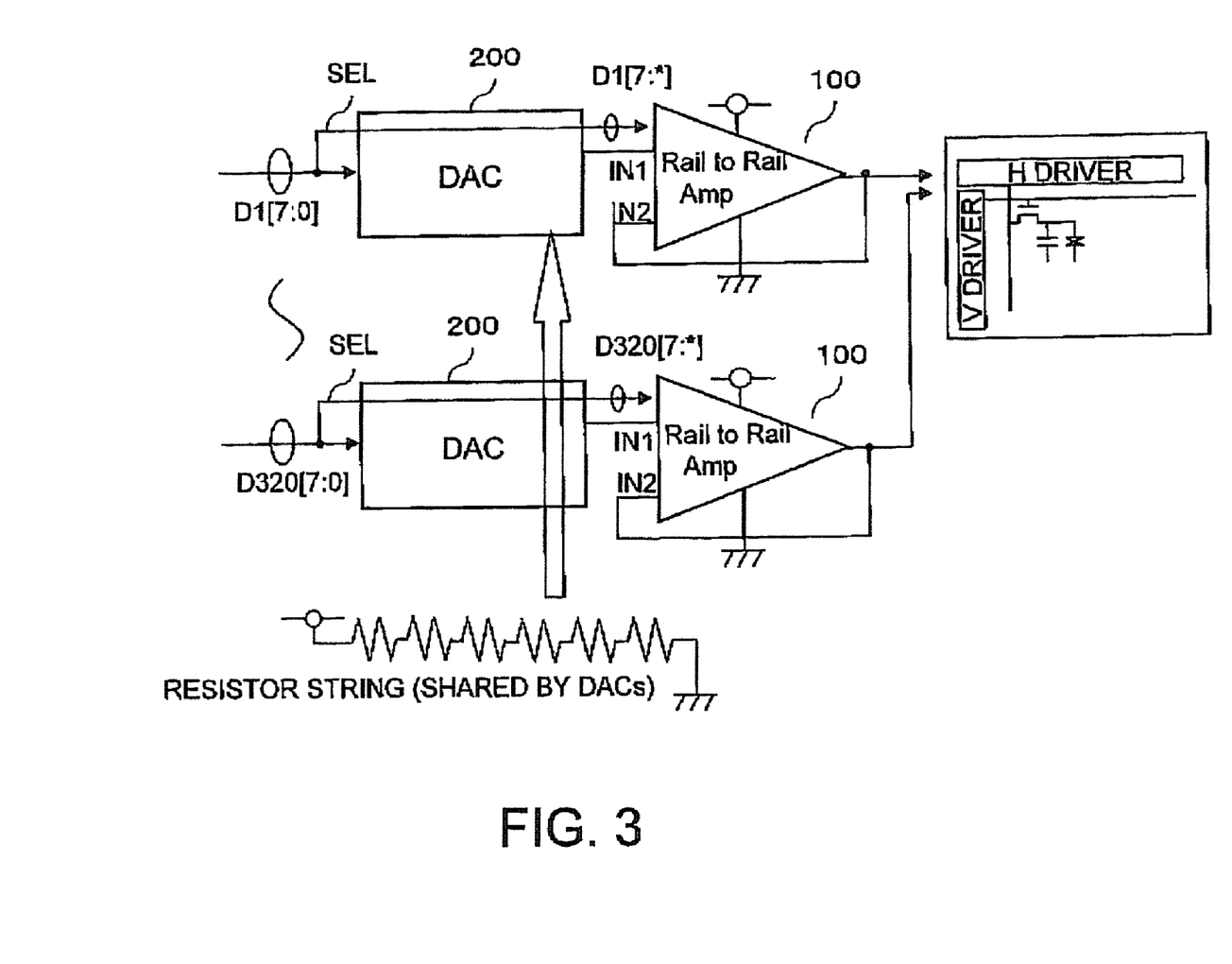
FIG. 3 shows an example of a configuration of rail-to-rail amplifiers relating to an embodiment of the present invention and DACs supplying analog signals to these amplifiers.

FIG. 3 conceptually shows rail-to-rail amplifiers 100 and digital-to-analog converters (DAC) 200 relating to embodiment 1. In this embodiment, the DACs 200 convert input digital signals (for example, 8-bit digital signals) to corresponding analog signals using a resistor string and supply the obtained analog signals to input sections (first and second differential input sections to be described hereinafter) of the rail-to-rail amplifiers 100. Furthermore, in the embodiment, in addition to the analog signal, a selection line is provided from the input section of the DAC 200 to the input section of the amplifier 100 for supplying a specific bit (in this example the most significant bit: MSB) of the input digital signal to the DAC 200 as a selection signal SEL to the amplifier 100.

Figure 4:
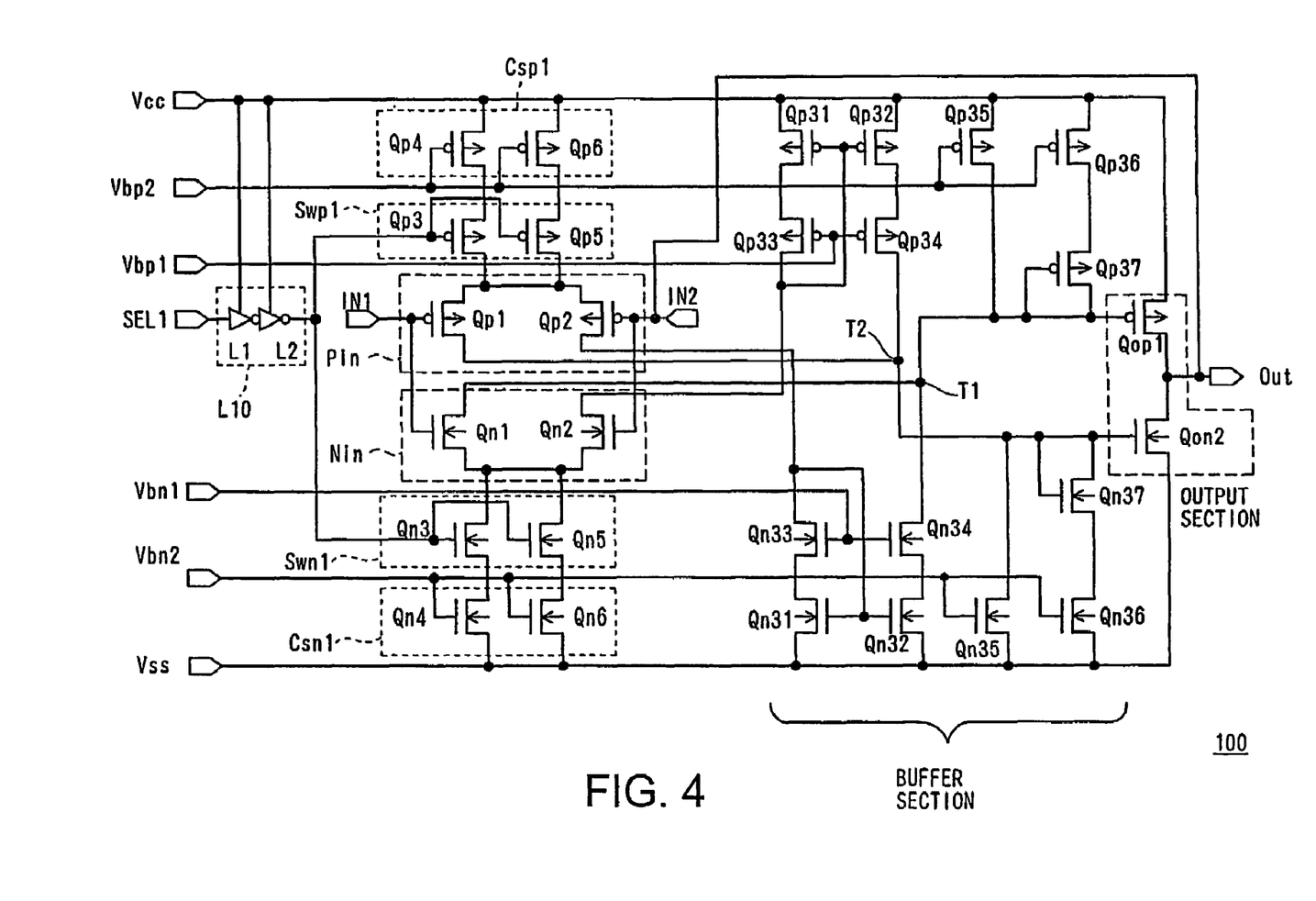
FIG. 4 shows an example of a circuit configuration of the rail-to-rail amplifier relating to the present embodiment.

A specific configuration of the rail-to-rail amplifier 100 will be described hereinafter with reference to FIG. 4. The rail-to-rail amplifier 100 basically includes an input section, which has a first differential input section including a pair of n-channel transistors and a second differential input section including a pair of p-channel transistors, a current supply for supplying current to the differential input sections, a buffer section for adjusting the current and voltage of a detection signal obtained at the input section, and an output section for amplifying and outputting the adjusted detection signal. Further included in the embodiment is a current controller for selecting a supply current ratio to the two differential input sections in accordance with the selection signal SEL from the above-mentioned DAC 200. By omitting the current mirror circuit and providing the current controller, the sum of the currents supplied to the input sections can be kept constant at all times.

After being converted by the above-mentioned DAC 200 to analog signals and amplified by the rail-to-rail amplifier 100, the amplified analog signals are supplied as data signals, for example, to a display device, such as a liquid crystal display (LCD), shown in FIG. 3. In FIG. 3, multiple DACs 200 and amplifiers 100 are provided. In this example, when the outputs of the amplifiers 100 are used as data signals to be supplied to the individual pixels of a panel having multiple pixels, it is necessary to process and supply multiple data signals corresponding to the number of pixels to the panel within a limited period of time. Thus, for one panel, multiple converters are provided in parallel for converting the digital data signals to analog data signals and parallel processing is performed. The multiple DACs 200 shown in FIG. 3 share a resistor string when converting digital signals to analog signals so that the surface area for the overall semiconductor device including the multiple DACs 200 can be minimized and variations in the voltage of the analog signals to be output among multiple DACs 200 (among multiple channels) can be prevented.

Next, a more specific circuit configuration of the rail-to-rail amplifier relating to embodiment 1 will be described with reference to FIG. 4. Parts in common with the configuration already described will be assigned the same reference numerals and their descriptions will be simplified.

The differential input section includes a positive input terminal IN1 and an inverting input terminal IN2. To both terminals IN1 and IN2 are connected a differential input Nin (first differential input) formed from a differential pair of n-channel transistors Qn1 and Qn2 and a differential input Pin (second differential input) formed from a differential pair of p-channel transistors Qp1 and Qp2.

A current supply Csp1 and a Pin current controller Swp1 are provided between a common terminal of the differential input Pin (source electrodes of transistors Qp1 and Qp2) and the high voltage side supply Vcc. The current supply Csp1 is formed from p-channel transistors having their gate electrodes connected to the bias supply Vbp2 and source electrodes connected to the supply Vcc. In the example of FIG. 4, two transistors Qp4 and Qp6 are provided in parallel and are always on. Currents from the supply Vcc are supplied to the Pin current controller Swp1.

The Pin current controller Swp1 is formed from two p-channels transistors Qp3 and Qp5, to their gate electrodes are supplied a selection signal from a logic circuit L10 (to be described hereinafter), and they turn on in accordance with the level (in this case an L level) of the selection signal so that currents from the corresponding current supply transistors Qp4 and Qp6 of the current supply Csp1 are supplied to the common terminal of the differential input Pin.

A current supply Csn1 and a Nin current controller Swn1 are provided between the common terminal (source electrodes of transistors Qn1 and Qn2) of the differential input Nin and the low voltage side supply Vss. The current supply Csn1 is formed from n-channel transistors having their gate electrodes connected to the bias supply Vbn2 and source electrodes connected to the supply Vss. In the example of FIG. 4, two transistors Qn4 and Qn6 are provided in parallel and are always on. Currents are drawn from the Nin current controller Swn1 side toward the supply Vss.

The Nin current controller Swn1 is formed from two n-channels transistors Qn3 and Qn5 and to their gate electrodes is supplied the same selection signal from the logic circuit L10 that is supplied to the Pin current controller Swp1. The transistors Qn3 and Qn5 of the Nin current controller Swn1 turn on in accordance with the level (in this case an H level) of the selection signal so that currents from the common terminal of the differential input Nin flow toward the current supply Csn1.

The selection signal supplied from the DAC is, in this example, the most significant bit as described hereinabove and is supplied from the selection terminal SEL1 to the logic circuit L10. The logic circuit L10 has, in this example, two stages of inverters L1 and L2. The logic circuit L10 adjusts the supplied MSB data into a selection signal having an amount of current necessary to operate the transistors Qp3, Qp5, Qn3, and Qn5 of the current controllers Swp1 and Swn1 and supplies the signal to the gate electrodes of the transistors Qp3, Qp5, Qn3, and Qn5.

Hereinafter, an example will be briefly described regarding the operation of the above-mentioned amplifier 100 where the number of bits in the input digital signal to the DAC 200 is 8, the DAC 200 converts the digital signal into a corresponding analog signal of level 0 to 255, and the analog signal is supplied to the positive input terminal IN1 of the amplifier 100.

When the analog signal is a voltage signal corresponding to level 255, an H level selection signal is supplied (an H level selection signal greater than or equal to level 128 is supplied) as MSB data to the logic circuit L10 of the amplifier 100. Thus, the transistors of the Pin current controller Swp1 formed from p-channel transistors do not turn on. On the other hand, the transistors Qn3 and Qn5 of the Nin current controller Swn1 formed from n-channel transistors turn on. Furthermore, since the analog signal supplied to other positive input terminal IN1 of the amplifier 100 is a voltage signal corresponding to level 255, the differential input Pin does not operate and the differential input Nin operates.

The sum of currents flowing from the common terminal of the differential input Nin to the current supply Csn1 via the Nin current controller Swn1 is constant and the transistor Qn1 of the differential input Nin supplies current in accordance with the difference between the voltage of the analog signal applied to the positive input terminal IN1 and the voltage (output voltage) applied to the inverting input terminal IN2 toward the transistor Qn2. In this example, if the total current flowing through the current supply Csn1 is 1, the current flowing to the transistor Qn1 becomes "1" and the current flowing to the transistor Qn2 becomes "0".

A drain electrode of the transistor Qn1 of the differential input Nin is connected to a node T1 of the buffer section. The node T1 is connected to the p-channel transistor Qp35 for current adjustment and the p-channel transistor Qp37 for voltage adjustment and further connected to a gate electrode of the p-channel output transistor Qop1 of the output section. A gate electrode of the transistor Qp35 is connected to the bias supply Vbp2 and a current in accordance with the bias supply voltage Vbp2 is supplied to the node T1. Furthermore, gate and drain electrodes of the transistor Qp37 are connected to the above-mentioned node T1 and a source electrode is connected to the supply Vcc via the transistor Qp36, which supplies current in accordance with the bias supply Vbp2.

A drain electrode of the transistor Qn2 of the differential input Nin is connected to a node T2 of the buffer section via the p-channel transistors Qp31 and Qp32 forming a current mirror circuit provided between the node T2 and the supply Vcc and the p-channel transistors Qp33 and Qp34 connected as a cascode with the transistors Qp31 and Qp32. Gate electrodes of the transistors Qp33 and Qp34 are connected in common with the bias supply Vbp1, gate electrodes of the above-mentioned transistors Qp31 and Qp32 are connected to a drain electrode of the transistor Qp33, and an output resistor is provided in the output path within the amplifier 100 to improve the gain of the amplifier.

Furthermore, node T2 is connected to the n-channel transistor Qn35 for current adjustment and the n-channel transistor Qn37 for voltage adjustment and further connected to a gate electrode of an n-channel output transistor Qon2 of the output section. A gate electrode of the transistor Qn35 is connected to the bias supply Vbn2 and a current in accordance with the bias supply voltage Vbn2 is drawn from the node T2. Furthermore, gate and drain electrodes of the transistor Qn37 are connected to the above-mentioned node T2 and a source electrode is connected to the supply Vss via the transistor Qn36 for supplying current in accordance with the bias supply Vbn2.

As described hereinabove, when the current flowing to the transistor Qn1 of the differential input Nin is "1" and the current flowing to the transistor Qn2 is "0", a current ratio of the node T1 and the node T2 is maintained at 1:0 so that the voltages at T1 and T2 are determined by these currents. Therefore, a signal having a maximum voltage (equivalent to Vcc in this case) is output from the p-channel transistor Qop1 of the output section.

When the analog signal is a voltage signal of level 0, an L level selection signal is supplied (an L level selection signal of level 0 to 127) to the logic circuit L10 of the amplifier 100, the transistors of the Nin current controller Swn1 do not operate and the transistors Qp3 and Qp5 of the Pin current controller Swp1 formed from p-channel transistors turn on. Furthermore, since the analog signal supplied to the positive input terminal IN1 of the amplifier 100 is a voltage signal corresponding to level 0, the differential input Pin operates and the differential input Nin does not operate.

Here, a drain electrode of the transistor Qp1 of the differential input Pin is connected directly to the above-mentioned node T2. On the other hand, a drain electrode of the transistor Qp2 is connected to the node T1 via the n-channel transistors Qn31 and Qn32 forming a current mirror circuit provided between the node T1 and the supply Vss and the n-channel transistors Qn33 and Qn34 connected as a cascode with the transistors Qn31 and Qn32. Gate electrodes of the transistors Qn33 and Qn34 are connected in common with the bias supply Vbn1, gate electrodes of the above-mentioned transistors Qn31 and Qn32 are connected to the drain electrode of the transistor Qn33, and together with the above-mentioned cascode connected circuit on the p-channel side, an output resistor is provided in the output path within the amplifier 100 to improve the gain of the amplifier.

When the selection signal SEL1 is an L level, the differential input Nin side does not operate. Thus, the voltage of the node T1 is determined by the output of the transistor Qp2 of the above-mentioned differential input Pin and the voltage of the node T2 is determined by the output of the transistor Qp1 of the same differential input Pin. In this example, the voltage of the node T2 becomes "1" with respect to the voltage "0" of the node T1 and a signal having a minimum voltage (equivalent to Vss in this case) is output from the n-channel transistor Qon1 of the output section.

In the circuit configuration shown in FIG. 4 as described hereinabove, the MSB data of the input digital signal to the DAC is supplied as the selection signal SEL so that in the case of 8-bit digital data (levels 0 to 255), the Pin current controller Swp1 operates to supply current to the differential input Pin when the analog signal supplied to the amplifier 100 has levels of 0 to 127, and the Nin current controller Swn1 operates to supply (draw) current to the differential input Nin when the analog signal has levels of 128 to 255.

Embodiment 2

Figure 5:
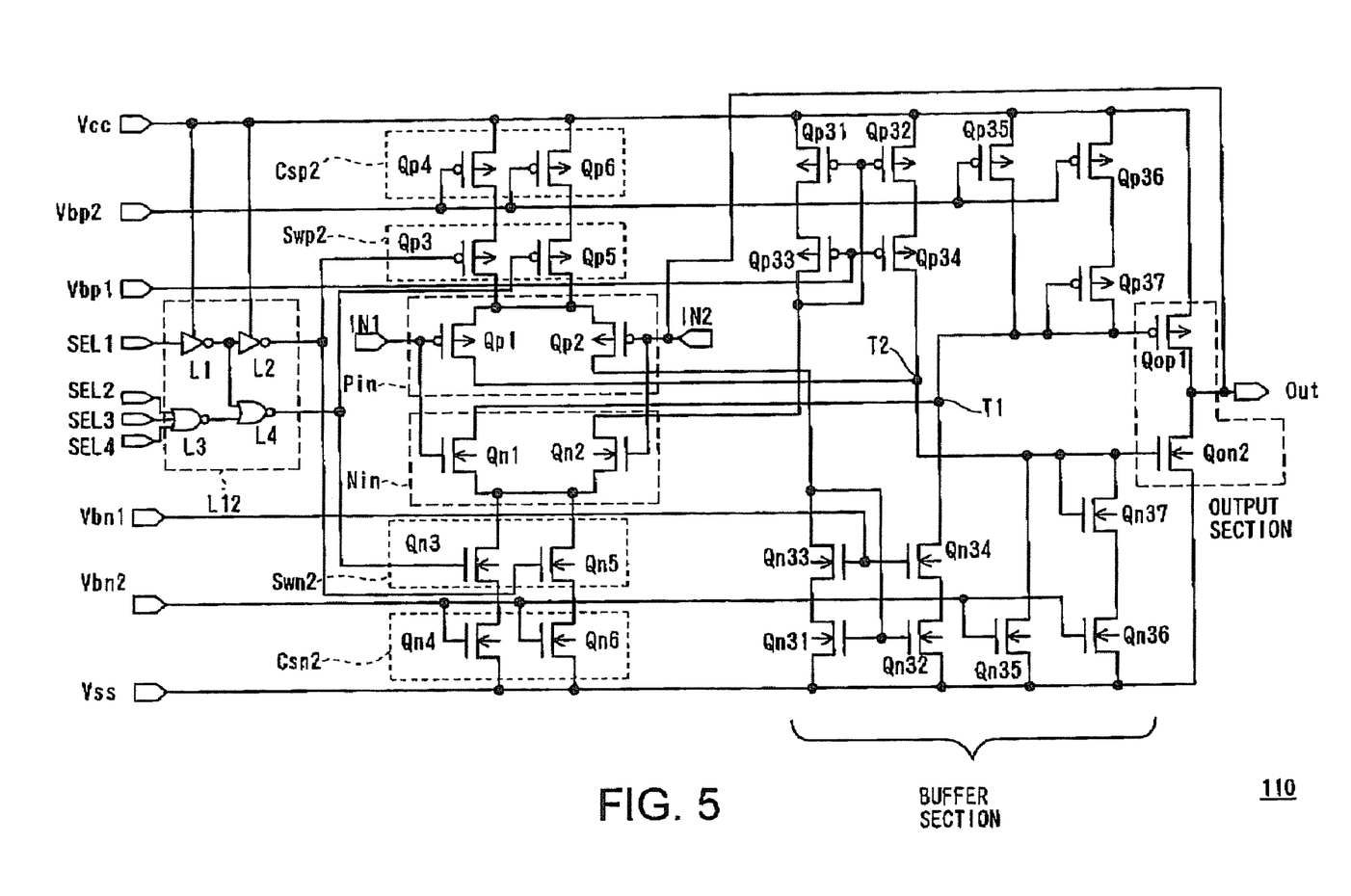
FIG. 5 shows an example of a circuit configuration of a rail-to-rail amplifier relating to embodiment 2.

FIG. 5 shows an example of a circuit configuration of a rail-to-rail amplifier 110 relating to embodiment 2. The difference with the circuit configuration shown in FIG. 4 is that multiple most significant data bits (4 most significant bits in this example) instead of the MSB are supplied as selection signals SEL1 to SEL4 to control a Pin current controller Swp2 and a Nin current controller Swn2.

A logic circuit L12 for processing multiple most significant bits includes two stages of inverters L1 and L2 for inverting and amplifying MSB data, a NOR gate L3 for obtaining the logical NOR of the selection signals SEL2 to SEL4 corresponding to the $2^{nd}$ digit to $4^{th}$ digit data bits from the MSB, and a NOR gate L4 for obtaining the logical NOR of the logical NOR result and the output of the inverter L1.

The selection signal having a level corresponding to the MSB data from the inverter L2 is supplied to one of the two p-channel transistors Qp3 and Qp5 (Qp3 in this case) provided in the Pin current controller Swp2 and one of the two n-channel transistors Qn3 and Qn5 (Qn5 in this case) provided in the Nin current controller Swn2 to control the operation of the corresponding transistors.

Furthermore, the output of the NOR gate L4 is supplied to one of the two p-channel transistors Qp3 and Qp5 (Qp5 in this case) provided in the Pin current controller Swp2 and one of the two n-channel transistors Qn3 and Qn5 (Qn3 in this case) provided in the Nin current controller Swn2 to control the operation of the corresponding transistors.

An H level is output from the NOR gate L3 when the $2^{nd}$ digit to $4^{th}$ digit data bits from the MSB are all L levels and an L level is output when at least one of the bits is an H level. If the MSB is an L level, an L level is output from the NOR gate L4 so that the output of the logic circuit L12 becomes (L, L). If the MSB is an H level and the remaining bits are all L levels, the output of the logic circuit L12 becomes (H, L), and if at least one of the remaining bits is an H level, the output of the logic circuit L12 becomes (H, H). Therefore, the current supply ratio to the differential input Pin and the differential input Nin is as follows:

(i) When the MSB is an L level and the other bits are L or H (L12 output=L, L)
    Pin:Nin=2:0

(ii) When the MSB is an H level and the other bits are L (L12 output=H, L)
    Pin:Nin=1:1

(iii) When the MSB is an H level and at least one of the other bits is H (L12 output=H, H)
    Pin:Nin=0:2

In the case where n=8 bits and the analog signal has a level of 0 to 127, current is supplied only to the differential input Pin, the differential input Pin operates, and a signal of the corresponding level 0 to 127 is amplified and output from the output transistor Qon2 side. If the level is 128, both the Pin current controller Swp2 and the Nin current controller Swn2 supply current at a ratio of 1:1, both the differential input Pin and the differential input Nin operate, the corresponding output transistors Qop2 and Qon2 operate in a balanced manner, and a signal having a voltage between the Vcc and Vss supplies is output. If the level is 144 to 255, current is supplied only to the differential input Nin so that the differential input Nin operates and a signal having a level corresponding to 144 to 255 is amplified and output from the output transistor Qop1 side.

In this manner, for an analog signal corresponding to an n-bit digital signal, embodiment 2 executes current ratio selection in 3 steps corresponding to the currents flowing to the differential input Pin and the differential input Nin.

Here, differences in power dissipation and offset voltage (corresponding to differential linearity error) will be described with reference to FIGS. 6 and 7 when using the amplifiers of the above-mentioned embodiments 1 and 2 and the amplifier of the related art.

Figure 6:
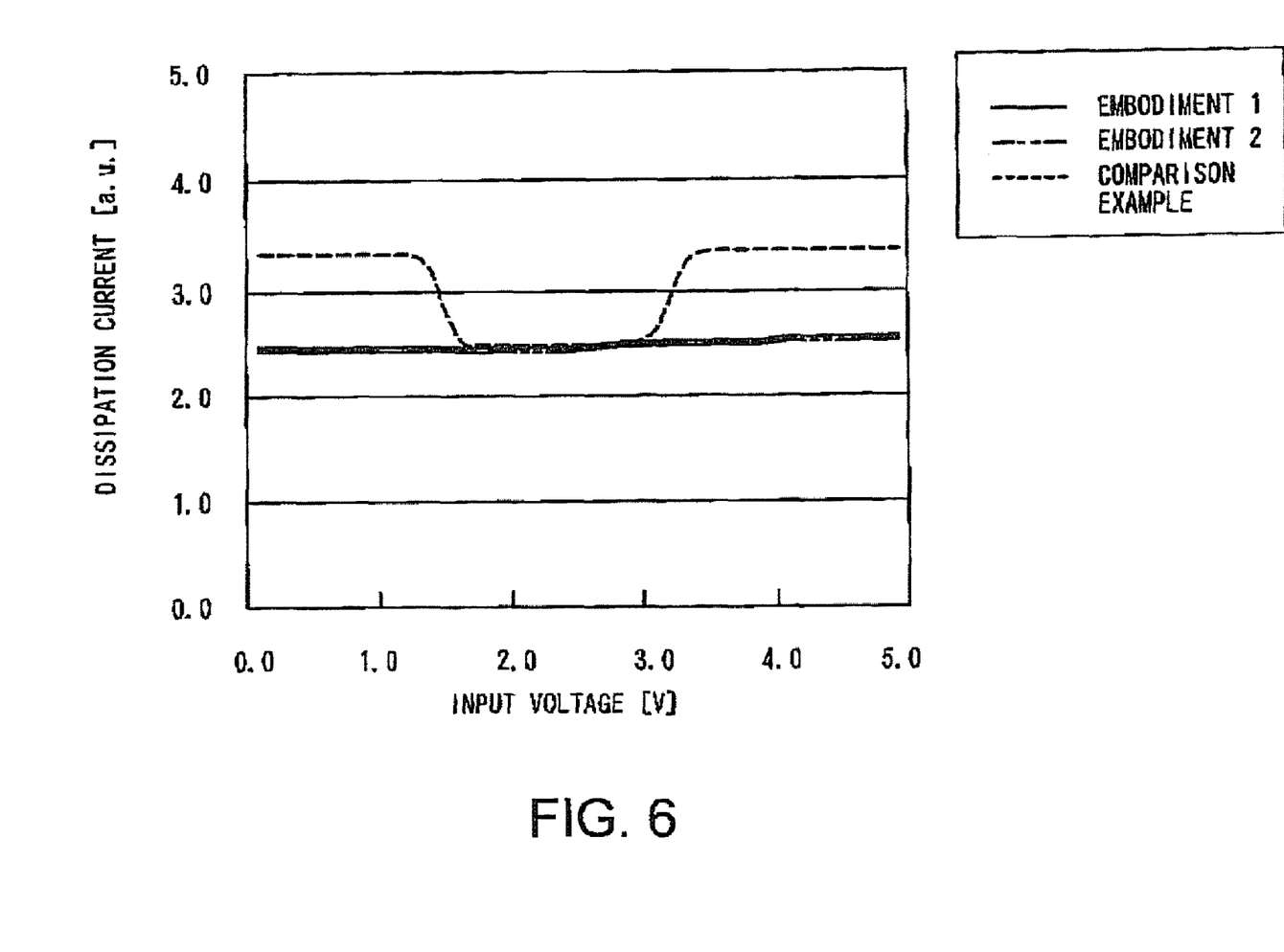
FIG. 6 shows changes in consumption current with respect to input voltage of the operational amplifier relating to the embodiment and the operational amplifier of the related art.

FIG. 6 shows the difference in dissipation current (A) with respect to input voltage (IN1) of the amplifiers (FIG. 4, FIG. 5) of embodiments 1 and 2 and the amplifier (FIG. 2) of the related art. In the figure, the solid line represents the characteristic of the amplifier of embodiment 1, the double dashed chain line represents the characteristic of the amplifier of embodiment 2, and the dotted line represents the characteristic of the amplifier of the related art. In an amplifier using current mirror circuits CMp1 and CMn1, such as in the related art, the dissipation current (consumption current) at the current mirror circuit CMp1 when operating only the differential input Pin and the dissipation current at the current mirror circuit CMn1 when operating only the differential input Nin respectively exist as described hereinabove. However, since the current mirror circuits can be omitted in both amplifiers 100 and 110 of embodiments 1 and 2, there is no dissipation current at the current mirror circuits and the dissipation current is constant regardless of the input voltage. In the example of FIG. 6, both embodiments 1 and 2 require only approximately 83% of the power dissipation of the related art and achieve lower power dissipation. Although these values may fluctuate depending on circuit characteristics, methods for selecting the current supply ratio to the differential inputs Nin and Pin by using specific bits of the input digital signal to the DAC as in embodiments 1 and 2 can achieve a lower power consumption of approximately 80% to 85% compared to the circuit of the related art that uses current mirror circuits. Furthermore, although not shown in FIG. 6, by omitting the current mirror circuits the amplifiers relating to the embodiments can be implemented in approximately 90% of the surface area compared to the method of the related art (a similar reduction in surface area can also be achieved by an amplifier of embodiment 3 to be described hereinafter).

Figure 7:
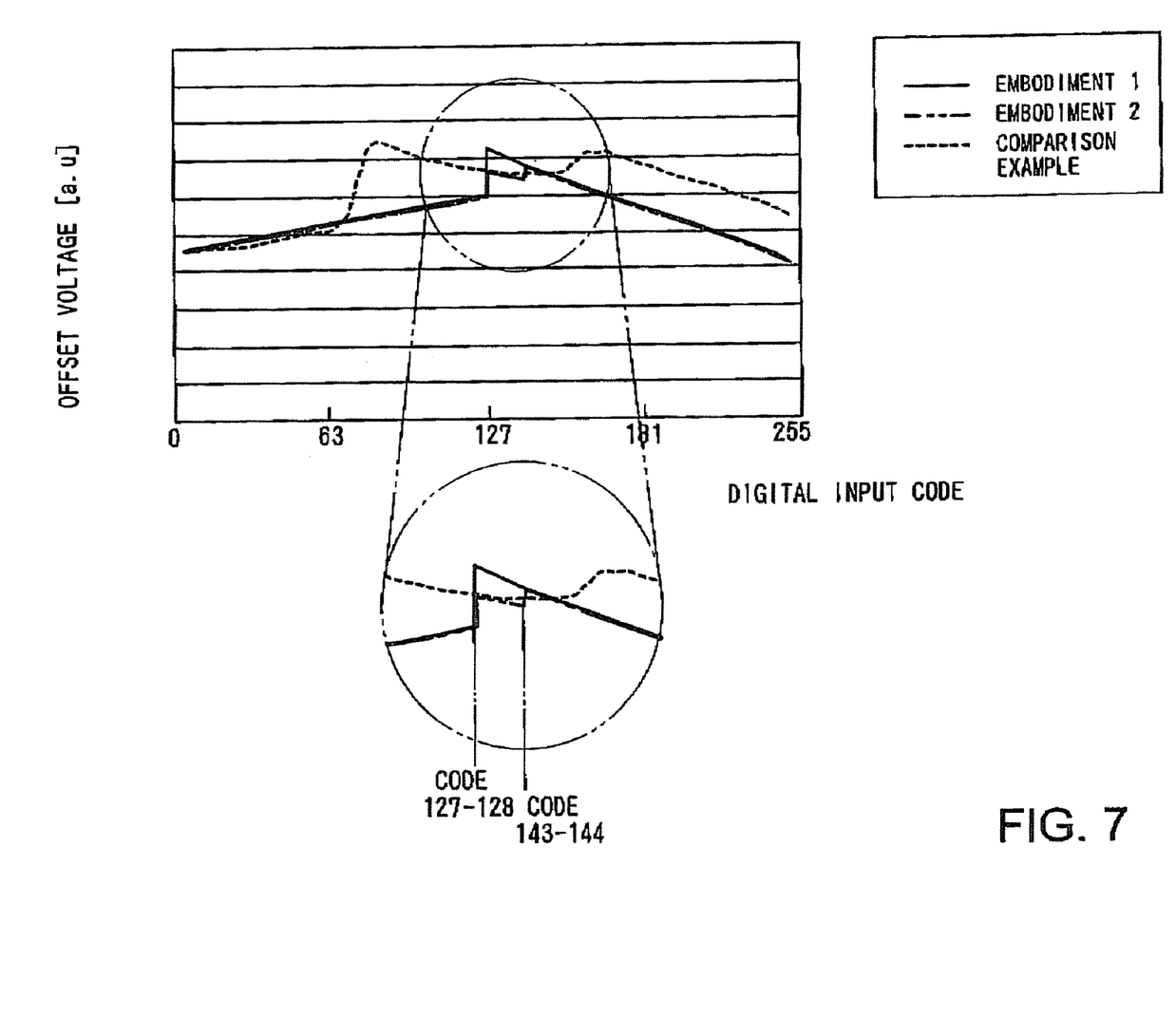
FIG. 7 shows changes in offset voltage with respect to input voltage of the operational amplifier relating to the embodiment and the operational amplifier of the related art.

FIG. 7 shows the difference in the change in offset voltage (in arbitrary units) with respect to input voltage of the amplifiers (FIG. 4, FIG. 5) relating to embodiments 1 and 2 and the amplifier (FIG. 2) of the related art. (Note that FIG. 7 is one example of the results in a state that does not include variations in circuit processes.) As in FIG. 6, the solid line in FIG. 7 represents the characteristic of the amplifier of embodiment 1, the double dashed chain line represents the characteristic of the amplifier of embodiment 2, and the dotted line represents the characteristic of the amplifier of the related art. For the purpose of illustration, a part circled in FIG. 7 is shown enlarged in the graph.

In the amplifier of the related art, the offset voltage changes in the curve in the respective selection region so as to select for operation the n-channel differential input, the p-channel differential input, or both differential input sections. However, relatively large offset voltages develop in the selection region.

In comparison, the amplifier 100 of embodiment 1 selects the operation of the differential input and the current supply ratio according to the MSB data so that a temporary offset voltage rise is observed in the input voltage corresponding to the CODE 127-128 during selection. However, once the selection is completed, it is clear the change in offset voltage thereafter is linear and compared to the related art the amount of change in the entire input voltage range is small.

The amplifier 110 of embodiment 2 uses the 4 most significant bits to perform twice the selection of the current supply ratio to the differential inputs Nin and Pin and operation of the differential inputs in 3 steps in accordance with the MSB data and the levels of the other bits. For this reason, as shown in FIG. 7, the amount of change in the selection region is reduced even when compared to the amount of change in embodiment 1. Therefore, it is clear that to improve the linearity at the point of change of the MSB of the digital signal, the operation selection in the differential input is executed using multiple bits instead of the MSB so that the amount of change during selection can be reduced. For example, it is possible for the amount of change in offset voltage of the amplifier 110 of embodiment 2 to be reduced to one half the amount of change of the amplifier 100 of embodiment 1.

Furthermore, by making the amount of change in the offset voltage smaller, as in embodiment 3 to be described hereinafter, for example, the differential linearity error with respect to the input analog signal can be improved.

Embodiment 3

Figure 8:
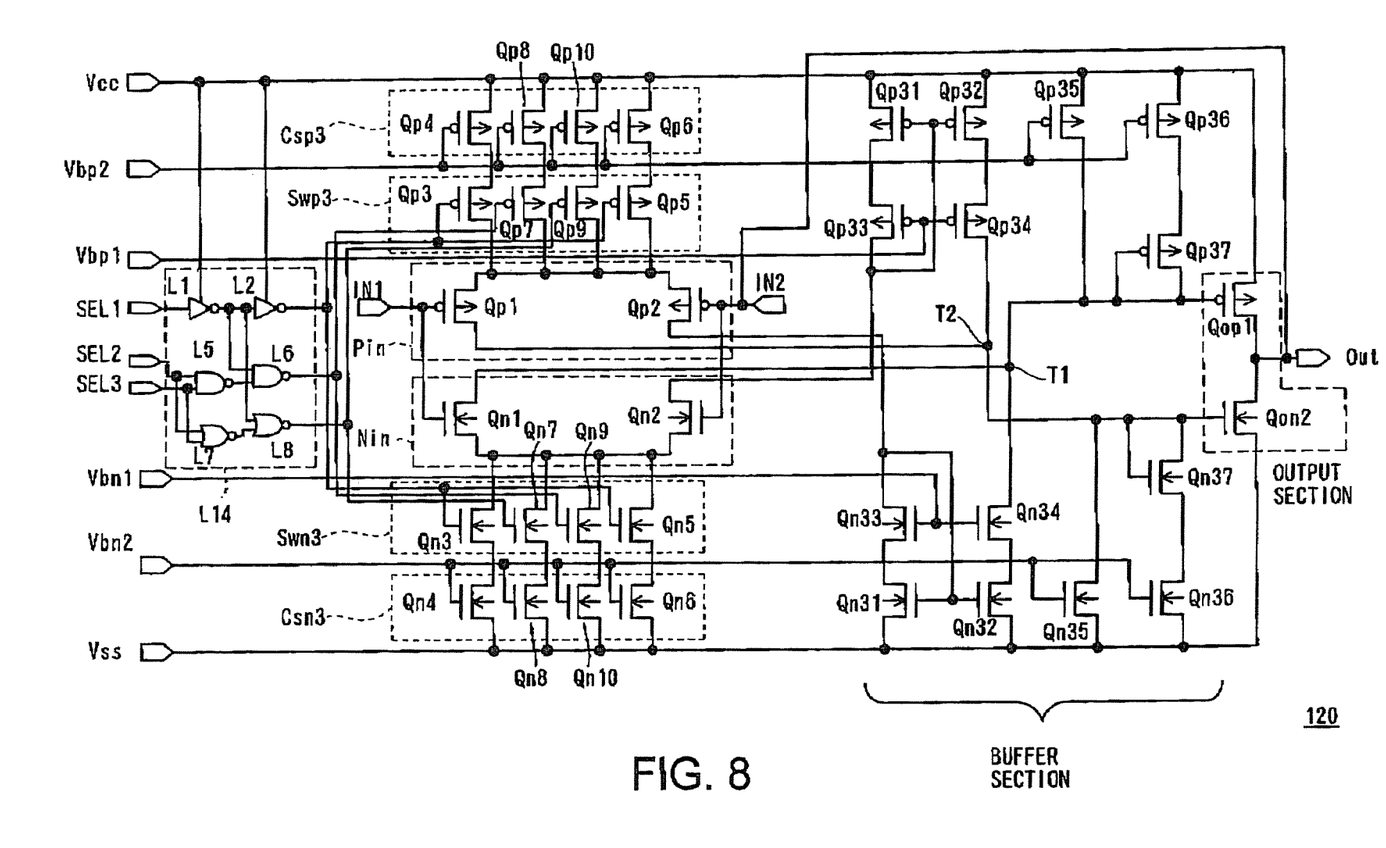
FIG. 8 shows an example of a circuit configuration of a rail-to-rail amplifier relating to embodiment 3.

FIG. 8 shows a circuit configuration of a rail-to-rail amplifier 120 relating to embodiment 3. The difference with the amplifier 110 (FIG. 5) relating to embodiment 2 is that the levels of the multiple most significant data bits are judged by a logic circuit L14 and the operation selection of the differential inputs is controlled three times in 4 steps in accordance with the levels. The logic circuit L14 includes two inverters L1 and L2 for amplifying MSB data, two NAND gates L5 and L6, and NOR gates L7 and L8. The NAND gate L5 obtains the logical NAND of the selection signals SEL2 and SEL3 corresponding to the $2^{nd}$ bit and $3^{rd}$ bit of the digital signal and the NOR gate L7 obtains the logical NOR of the selection signals SEL2 and SEL3 corresponding to the $2^{nd}$ bit and $3^{rd}$ bit. The NAND gate L6 obtains the logical NAND of the output of the NAND gate L5 and the output of the inverter L1, and the NOR gate LB obtains the logical NOR of the output of the NOR gate L7 and the output of the inverter L1.

Furthermore, a Pin current controller Swp3 includes p-channel transistors Qp3 and Qp5, to the gates of which is supplied the selection signal SEL1 in accordance with the MSB, a p-channel transistor Qp7, to the gate of which is supplied an output of the NAND gate L6, and a p-channel transistor Qp9, to the gate of which is supplied an output of the NOR gate L8. Moreover, current supply transistors Qp4, Qp6, Qp8, and Qp10 of a current supply Csp3 provided between the supply Vcc and the Pin current controller Swp3 are respectively connected to the above-mentioned transistors Qp3, Qp5, Qp7, and Qp9.

The Nin current controller Swn3 includes n-channel transistors Qn3 and Qn5, to the gates of which is supplied the selection signal SEL1 in accordance with the MSB, a p-channel transistor Qn9, to the gate of which is supplied the output of the NAND gate L6, and a p-channel transistor Qn7, to the gate of which is supplied the output of the NOR gate L8. Furthermore, current supply transistors Qn4, Qn6, Qn8, and Qn10 of a current supply Csn3 provided between the Nin current controller Swn3 and the supply Vss are respectively connected to the above-mentioned transistors Qn3, Qn5, Qn7, and Qn9.

An example of the current supply selection operation for this sort of circuit configuration will be described hereinafter. When the MSB, $2^{nd}$ digit and $3^{rd}$ digit data bits (SEL1, SEL2, SEL3) are at an L level, the inverter L2 output, NAND gate L6 output, and NOR gate L8 output are all L levels. When the MSB is an L level and the remaining bits are H levels, the inverter L2 output, NAND gate L6 output, and NOR gate LB output become (L, H, L).

When the MSB is an H level and the remaining bits are L levels, the inverter L2 output, NAND gate L6 output, and NOR gate L8 output become (H, H, L). Furthermore, when SEL1, SEL2, and SEL3 are all H levels, the inverter L2 output, NAND gate L6 output, and NOR gate L8 output all become H levels. Therefore, the current supply ratio to the differential input Pin and the differential input Nin can be summarized as follows:

(i) When MSB is L level and the other bits are also L levels, Pin:Nin=4:0

(ii) When MSB is L level and the other bits are H levels, Pin:Nin=3:1

(iii) When MSS is H level and the other bits are L levels, Pin:Nin=1:3

(iv) When MSB is H level and the other bits are H levels, Pin:Nin=0:4

In the case of (i) in the above-mentioned current supply ratio example, only the differential input Pin operates and in the case of (iv), only the differential input Nin operates. Therefore, at the nodes T1 and T2, the levels of the output signals are determined in accordance with the voltage of the drain output (node T2) of the p-channel transistor Qp1 when only the differential input Pin operates and the drain output (node T1) of the n-channel transistor Qn1 when only the differential input Nin operates.

In the case of (ii) and (iii), both differential inputs Pin and Nin operate and due to the current mirror circuit Qp31 and Qp32 the output signal of the transistor Qp1 of the differential input Pin at the node T2 and the output signal of the transistor Qn2 of the differential input Nin at the time are summed at a current ratio controlled by the selection signals. Then, the output transistors Qop1 and Qon2 respectively operate in accordance with the output signals obtained from the nodes T1 and T2 so that an amplified signal corresponding to the supplied analog signal is obtained at the output terminal Out.

As described hereinabove, in the amplifier 120 of embodiment 3, the 3 most significant bits are used to control the current supply ratio with respect to the input voltage in 4 steps to enable finer adjustments than in the amplifier 110 of embodiment 2. For example, if the DAC converts 10-bit digital data, an increase of the differential linearity error in the current supply ratio selection region is suppressed and sufficient conversion precision can be maintained. Furthermore, by modifying the configuration of the logic circuit L14, a current supply ratio of Pin:Nin=2:2 can be achieved using the 3 most significant bits. In this case, the current supply ratio is selected in 5 steps and a further reduction in the differential linearity error becomes possible.

Furthermore, when the output of the DAC and amplifier according to embodiments 1 to 3 is supplied to individual pixels of a display panel as display data as shown in FIG. 3, besides linear digital-to-analog conversion, γ correction is applied according to the panel display characteristic. Accordingly, digital data for γ correction is further supplied to the amplifier of the embodiment (particularly, embodiments 2 and 3) and the selection range at the low voltage side of the analog signal may be made narrower than the selection range of the high voltage side to improve conversion and amplification precision of the analog signal at the low voltage side.

In embodiments 1 to 3 hereinabove, the bias supply voltages Vbp1, Vbp2, Vbn1, and Vbn2 are set to optimum voltages according to the threshold value, current characteristic, amplification factor, and so forth of the circuit elements of the respective amplifiers. As an example, when the supply Vcc is 5 V and the supply Vss is 0 V (ground), Vbp1, Vbp2, Vbn1, and Vbn2 can be respectively set to 4.5 V, 3.5 V, 1.5 V, and 1.0 V.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A rail-to-rail amplifier for amplifying an analog signal from a digital-to-analog converter comprising:
   a first differential input section comprising an n-channel transistor pair;
   a second differential input section comprising a p-channel transistor pair;
   a first current supply, disposed between said second differential input section and a high voltage side first supply line, for supplying current from said first supply line to said second differential input section;
   a current controller for a second input section, disposed between said first current supply and said second differential input section, for controlling the current supply from said first current supply to said second differential input section in accordance with digital data at a predetermined bit position in input digital data to said digital-to-analog converter;
   a second current supply, disposed between a low voltage side second supply line and said first differential input section, for supplying current from said first differential input section to said second supply line; and
   a current controller for a first input section, disposed between said second current supply and said first differential input section, for controlling the current supply from said first differential input section to said second current supply in accordance with digital data at a predetermined bit position in input digital data to said digital-to-analog converter.

2. A rail-to-rail amplifier according to claim 1, wherein:
   said digital data supplied to said current controller for the first input section and said current controller for the second input section is the most significant bit of the input digital data to said digital-to-analog converter.

3. A rail-to-rail amplifier according to claim 1, wherein:
   said digital data supplied to said current controller for the first input section and said current controller for the second input section is data of multiple most significant bit positions including the most significant bit data of the input digital data to said digital-to-analog converter, and in accordance with the supplied data of multiple bit positions, a ratio of current flowing to said first differential input section and said second differential input section is controlled.

4. A semiconductor device comprising a digital-to-analog converter and a rail-to-rail amplifier for amplifying an analog signal from said digital-to-analog converter, said rail-to-rail amplifier comprising:
   a first differential input section comprising an n-channel transistor pair;
   a second differential input section comprising a p-channel transistor pair;
   a first current supply, disposed between said second differential input section and a high voltage side first supply line, for supplying current from said first supply line to said second differential input section;
   a current controller for a second input section, disposed between said first current supply and said second differential input section, for controlling the current supply from said first current supply to said second differential input section in accordance with digital data at a predetermined bit position in input digital data to said digital-to-analog converter;
   a second current supply, disposed between said first differential input section and a low voltage side second supply line, for supplying current from said first differential input section to said second supply line; and
   a current controller for a first input section, disposed between said second current supply and said first differential input section, for controlling the current supply from said first differential input section to said second current supply in accordance with digital data at a predetermined bit position in input digital data to said digital-to-analog converter;
   wherein said digital data supplied to said current controller for the first input section and said current controller for the second input section is data of multiple most significant bit positions including the most significant bit of input digital data to said digital-to-analog converter, and in accordance with the supplied data of multiple most significant bit positions, the ratio of current flowing to said first differential input section and said second differential input section is controlled and a differential linearity error of said digital-to-analog converter is adjusted.

* * * * *